(12) United States Patent
Wu et al.

(10) Patent No.: US 7,375,020 B2
(45) Date of Patent: *May 20, 2008

(54) METHOD OF FORMING BUMPS

(75) Inventors: Tsung-Hua Wu, Kaohsiung Hsien (TW); Min-Lung Huang, Kaohsiung (TW); Shih-Chang Lee, Kaohsiung (TW); Jen-Kuang Fang, Pingtung Hsien (TW); Yung-I Yeh, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 218 days.

This patent is subject to a terminal disclaimer.

(21) Appl. No.: 10/904,623

(22) Filed: Nov. 19, 2004

(65) Prior Publication Data

US 2005/0085061 A1 Apr. 21, 2005

Related U.S. Application Data

(63) Continuation of application No. 10/604,324, filed on Jul. 11, 2003, now Pat. No. 6,916,732.

(30) Foreign Application Priority Data

Jul. 18, 2002 (TW) ............................. 91115993 A (51) Int. Cl.
 *H01L 21/44* (2006.01)
(52) U.S. Cl. .......................... 438/613; 257/E21.508
(58) Field of Classification Search ................ 438/613
 See application file for complete search history.

(56) References Cited

U.S. PATENT DOCUMENTS

| 5,324,569 | A  | * | 6/1994  | Nagesh et al. ............. 428/198 |
| 5,431,332 | A  | * | 7/1995  | Kirby et al. ................ 228/246 |
| 5,846,875 | A  | * | 12/1998 | Haji .......................... 438/614 |
| 5,985,694 | A  | * | 11/1999 | Cho ........................... 438/108 |
| 6,169,022 | B1 | * | 1/2001  | Saitou ....................... 438/613 |
| 6,213,386 | B1 | * | 4/2001  | Inoue et al. ................ 228/245 |
| 6,287,893 | B1 | * | 9/2001  | Elenius et al. ............. 438/108 |
| 6,350,668 | B1 | * | 2/2002  | Chakravorty .............. 438/612 |
| 6,426,545 | B1 | * | 7/2002  | Eichelberger et al. ...... 257/633 |

(Continued)

OTHER PUBLICATIONS

Tummala et al., Microelectronics Packaging Handbook-Semiconductor Packaging:Part II, 2nd Edition, Chapman & Hall, 1997, p. 153.*

*Primary Examiner*—David A Zarneke
(74) *Attorney, Agent, or Firm*—Jianq Chyun IP Office (57) ABSTRACT

The present invention provides a method of forming a plurality of bumps over a wafer. The wafer has a plurality of contact pads and a passivation layer thereon and the passivation layer exposes the contact pads. An adhesion layer is formed over the active surface of the wafer and covers both the contact pads and the passivation layer. A metallic layer is formed over the adhesion layer. The patterned adhesion layer and patterned metallic layer remain on top of the contact pads. A photoresist layer having a plurality of openings that expose the metallic layer is formed on the active surface of the wafer. A flux material is deposited into the openings and then a solder block is disposed into each of the openings. A reflow process is performed to bond the solder block with the metallic layer. Finally, the flux material and the photoresist layer are removed.

10 Claims, 7 Drawing Sheets

U.S. PATENT DOCUMENTS

| | | | |
|---|---|---|---|
| 6,426,564 B1 * | 7/2002 | Ball | 257/783 |
| 6,475,896 B1 * | 11/2002 | Hashimoto | 438/613 |
| 6,506,681 B2 * | 1/2003 | Grigg et al. | 438/692 |
| 6,513,701 B2 * | 2/2003 | Mead et al. | 228/248.1 |
| 6,541,364 B2 * | 4/2003 | Mukuno et al. | 438/612 |
| 6,639,315 B2 * | 10/2003 | Kazama et al. | 257/738 |
| 6,720,244 B2 * | 4/2004 | Tong et al. | 438/613 |
| 6,730,589 B2 * | 5/2004 | Hashimoto | 438/613 |
| 6,743,660 B2 * | 6/2004 | Lee et al. | 438/108 |
| 6,750,135 B2 * | 6/2004 | Elenius et al. | 438/615 |
| 6,854,633 B1 * | 2/2005 | Grigg et al. | 228/33 |
| 6,872,650 B2 * | 3/2005 | Anzai | 438/612 |
| 6,908,842 B2 * | 6/2005 | Chen et al. | 438/613 |
| 6,916,732 B2 * | 7/2005 | Wu et al. | 438/613 |
| 6,939,790 B2 * | 9/2005 | Chen et al. | 438/614 |
| 6,946,723 B2 * | 9/2005 | Satoh et al. | 257/669 |
| 7,045,388 B2 * | 5/2006 | Tatsumi et al. | 438/108 |
| 7,045,389 B1 * | 5/2006 | Tatsumi et al. | 438/108 |
| 2004/0217453 A1 * | 11/2004 | Ogino et al. | 257/669 |

* cited by examiner

METHOD OF FORMING BUMPS

CROSS-REFERENCE TO RELATED APPLICATION

This application is a continuation of a prior application Ser. No. 10/604,324, filed on Jul. 11, 2003, now U.S. Pat No. 6,916,732, which claims the priority benefit of Taiwan application Ser. No. 91115993, filed on Jul. 18, 2002.

BACKGROUND OF THE INVENTION

1. Field of Invention

The present invention relates to a method of forming bumps. More particularly, the present invention relates to a method of forming high-quality bumps inside a high-density package.

2. Description of Related Art

In this information explosion age, integrated circuit products are used almost everywhere in our daily life. As fabricating technique continue to improve, electronic products having powerful functions, personalized performance and a higher degree of complexity are produced. Nowadays, most electronic products are relatively light and have a compact body. Hence, in semiconductor production, various types of high-density semiconductor packages have been developed. Flip chip is one of the most commonly used techniques for forming an integrated circuit package. In a flip-chip package, the bonding pads on a die and the contact points on a substrate are connected together through a plurality of bumps. Hence, compared with a wire-bonding package or a tape automated bonding (TAB) package, a flip-chip package uses a shorter electrical path on average and has a better overall electrical performance. Moreover, the back of a flip-chip die may be exposed to increase heat dissipation. Due to the above and other reasons, flip-chip packages are produced in large quantities in the semiconductor industry.

Figure 1:
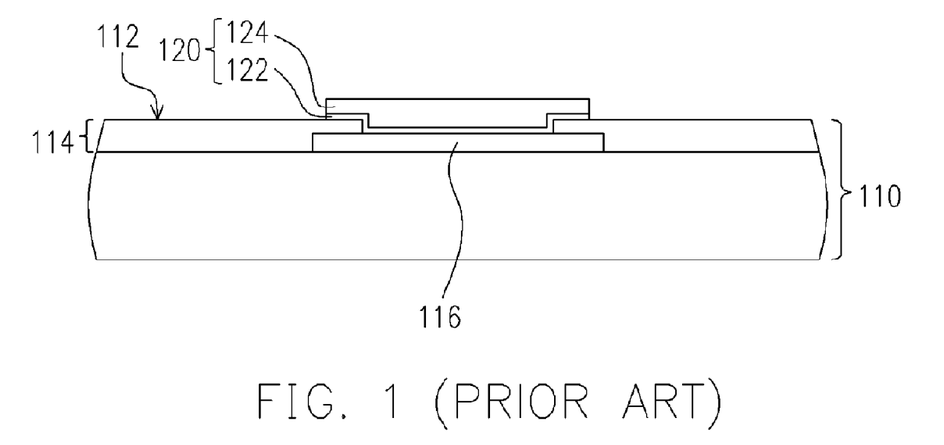
FIGS. 1 through 5 are partially magnified cross-sectional views showing the progression of steps in a conventional method of forming a bump on the surface of a chip.

FIGS. 1 through 5 are partially magnified cross-sectional views showing the progression of steps in a conventional method of forming a bump on the surface of a chip. As shown in FIG. 1, a silicon wafer 110 is provided. The wafer 110 has an active surface 112 with a passivation layer 114 and a plurality of contact pads 116 (only one of the contacts is shown) thereon. The passivation layer 114 exposes the contact pads 116. An under-ball metallic (UBM) layer 120 is formed over the contact pad 116. The under-ball metallic layer 120 includes an adhesion layer 122 and one or a stack of metallic layers 124. To form the under-ball metallic layer 120, a sputtering process is first conducted to form an adhesion layer 122 on the active surface 112 of the wafer 110. Next, a sputtering or plating process is conducted to form one or more metallic layers 124 over the adhesion layer 122. Thereafter, photolithography and etching processes are used to pattern the under-ball metallic layer 120 so that a residual portion of the under-ball layer 120 remains on top of the contact pad 116.

Figure 2:
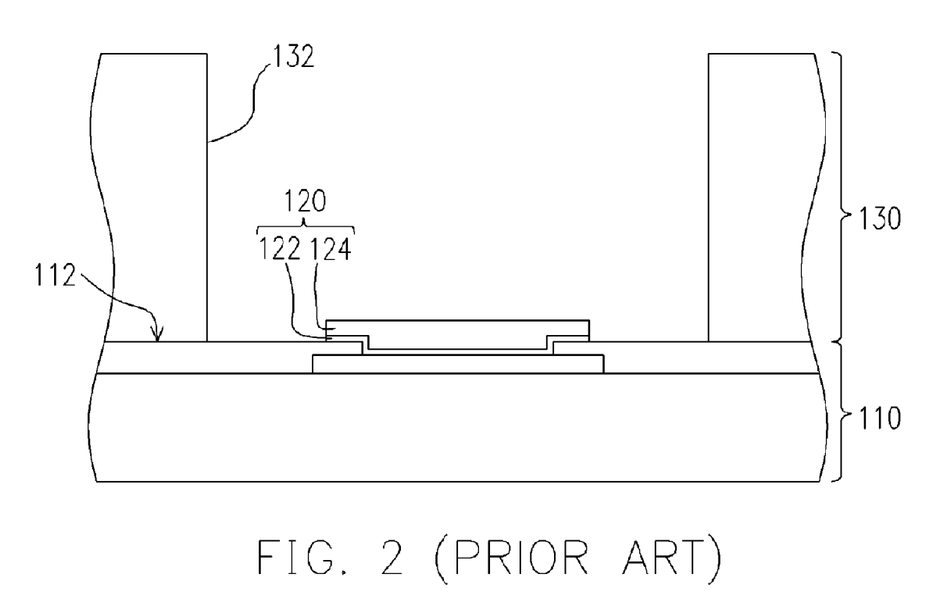
Figure 3:
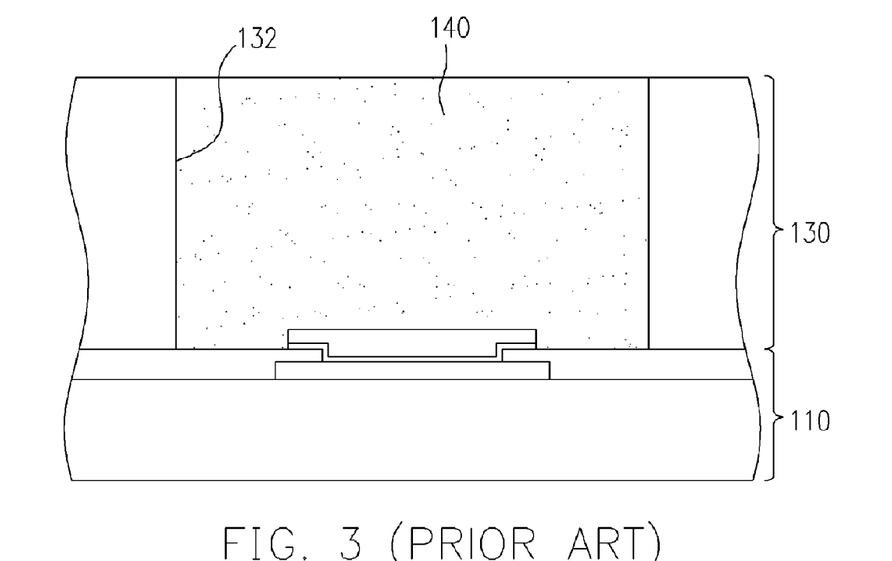

As shown in FIG. 2, a spin-coating process is conducted to form a photoresist layer 130 over the active surface 112 of the wafer 110. Through photolithography and etching processes, a plurality of openings 132 (only one opening is shown) are formed in the photoresist layer 130. The openings 132 expose the under-ball metallic layer 120. A printing process is conducted to deposit solder material 140 into the opening 132 of the photoresist layer 130 as shown in FIG. 3. The solder material 140 includes granulated metallic particles, a reductant, a dispersion agent and other solvents.

Figure 4:
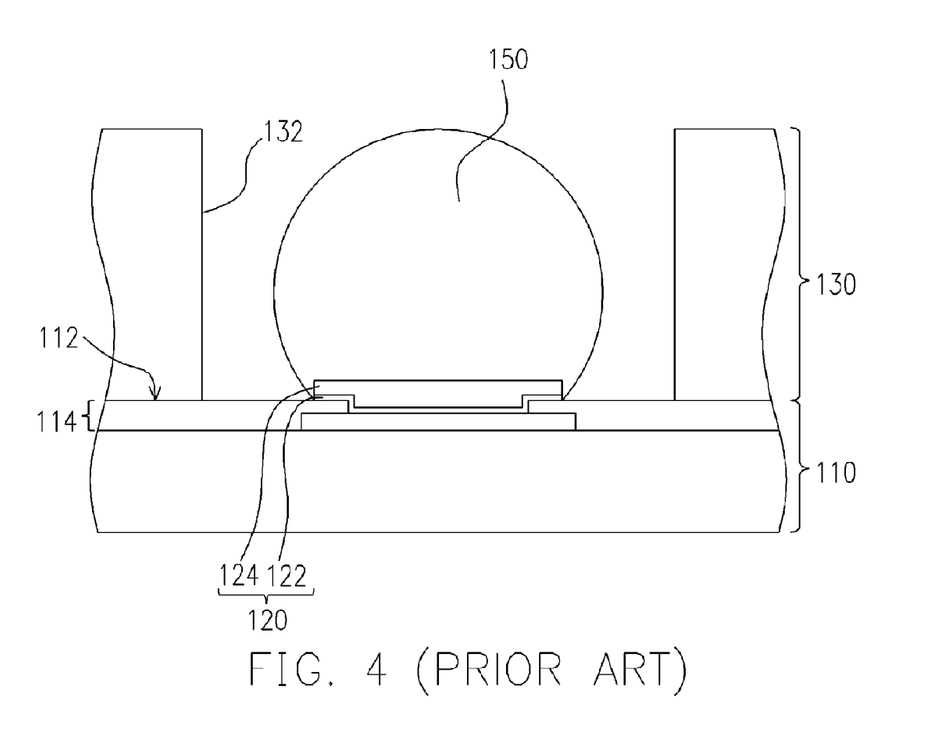
Figure 5:
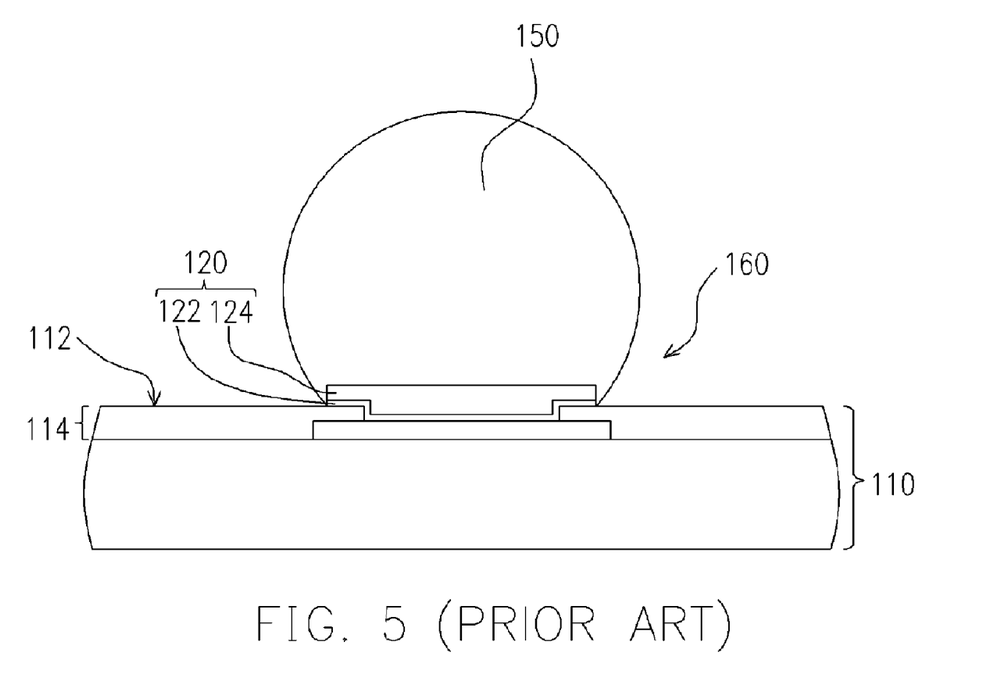

Through a reflex process, the metallic particles inside the solder material 140 are fused to form a hemispherical solder block 140 as shown in FIG. 4. The solder block 150 is formed directly over the under-ball metallic layer 120 while the reductant, the dispersion agent and other solvents move to the surface of the solder block 150. Thereafter, a liquid cleaner is applied to remove the reductant, the dispersion agent and other solvents from the surface of the solder block 150. Finally, the photoresist layer 130 is removed from the active surface 112 of the wafer 110 as shown in FIG. 5 so that a bump 160 is produced. The bump 160 actually comprises the solder block 150 and the under-ball metallic layer 120.

In the aforementioned fabrication process, the solder material 140 is deposited into the openings 132 of the photoresist layer 130 by printing. However, the printing process may result in the solder material 140 filled into part of the openings 132. Hence, dimensions of the solder blocks 150 after a reflow process may vary considerably. Also, if the dimensions of the openings 132 of the photoresist layer 130 vary over a range, the volume of solder material 140 deposited into the openings 132 varies considerably. Accordingly, the dimensions of the solder blocks 150 after a reflow process varu considerably due to the above reason.

Since the solder material 140 contains reductant, dispersion agent and other solvents, these materials may react with the photoresist layer 130 to produce gases that are trapped in the solder block 150. Alternatively, if some residual reductant, dispersion agent or other solvents remain within the solder block 150 without moving to the surface of the solder block 150, voids are created inside the solder block 150. These internal voids may compromise the reliability of the bond between the solder block 150 and the substrate (not shown).

Since the solder material 140 contains reductant, dispersion agent and solvents, besides metallic particles, the solder block 150 after a reflow process will have a volume considerably smaller than the solder material 140 deposited in the opening 132. Thus, to form a solder block 150 having the correct height level and volume, the photoresist layer 130 must have considerable thickness and the opening 132 of the photoresist layer 130 must have considerable dimension. Hence, the solder blocks 150 must be separated from each other by a considerable distance, rendering the production of higher-density packages difficult.

Furthermore, after printing the solder material 140 into the opening 132 of the photoresist layer 130, if the solder material 140 is suspended in the opening 132, the solder material 140 separated from the under-ball metallic layer 120, the disconnection between the solder material 140 and the under-ball metallic layer 120 is not easy to be discovered. Thus, a missing block phenomenon may occur after a reflow process.

SUMMARY OF THE INVENTION

Accordingly, one object of the present invention is to provide a method of forming bumps capable of reducing size variation between solder blocks.

A second object of this invention is to provide a method of forming bumps capable of reducing the production of voids inside solder blocks.

A third object of this invention is to provide a method of forming bumps capable of reducing distance of separation between neighboring solder blocks so that a higher packing density is possible.

A fourth object of this invention is to provide a method of forming bumps capable of reducing the occurrence of missing block condition.

To achieve these and other advantages and in accordance with the purpose of the invention, as embodied and broadly described herein, the invention provides a method of forming a plurality of bumps over a silicon wafer. The wafer has an active surface having a passivation layer and a plurality of contact pads thereon. The passivation layer exposes the contact pads on the active surface. To form the bumps, an adhesion layer is formed over the active surface of the wafer covering both the contact pads and the passivation layer. A metallic layer is formed over the adhesion layer. The adhesion layer and the metallic layer are patterned so that the adhesion layer and the metallic layer remain on top of the contact pads. Thereafter, a photoresist layer is formed on the active surface of the wafer. The photoresist layer has a plurality of openings that exposes the metallic layer. Flux material is deposited into the openings and then a solder block is disposed into each opening. A reflow process is carried out so that the solder block bonds with the metallic layer. Finally, the flux material is cleared and the photoresist layer is removed.

According to one preferred embodiment of this invention, material constituting the adhesion layer includes aluminum, titanium, titanium-tungsten alloy, chromium, chromium-copper alloy, copper or tantalum. Material constituting the metallic layer includes nickel-vanadium alloy, titanium nitride compound, tantalum nitride compound, nickel, chromium-copper alloy, chromium, copper, palladium or gold. Material constituting the solder block includes lead-tin alloy or lead-free alloy, and the lead-free alloy includes tin, gold, copper, magnesium, bismuth, antimony, indium, zinc or an alloy made of part or all of the above metals. In addition, material constituting the contact pad includes copper or aluminum.

Since the solder blocks are prefabricated before being disposed into the openings in the photoresist layer, shape and interior constituents of the solder block can be carefully controlled. With careful control of the fabrication process, number and size of voids inside each solder block can be set within an acceptable range. Thus, reliability of the bond between the solder block and the substrate as well as between the solder block and the under-ball metallic layer is improved. Because the size of each solder block is uniform, the solder block is at a standard height level above the under-ball metallic layer after a reflow process. Moreover, the size of the openings in the photoresist layer can be greatly reduced. Only if the solder blocks with a standard size can be accommodated into the openings, the openings formed can be as small as possible. With smaller openings, the distance between neighboring solder blocks can be reduced and a higher-density package can be produced. In addition, if a solder block is missing or does not fit into a particular opening, the vacant or misfit location can be easily found by visual inspection. Ultimately, missing block conditions will rarely occur.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

Figure 6:
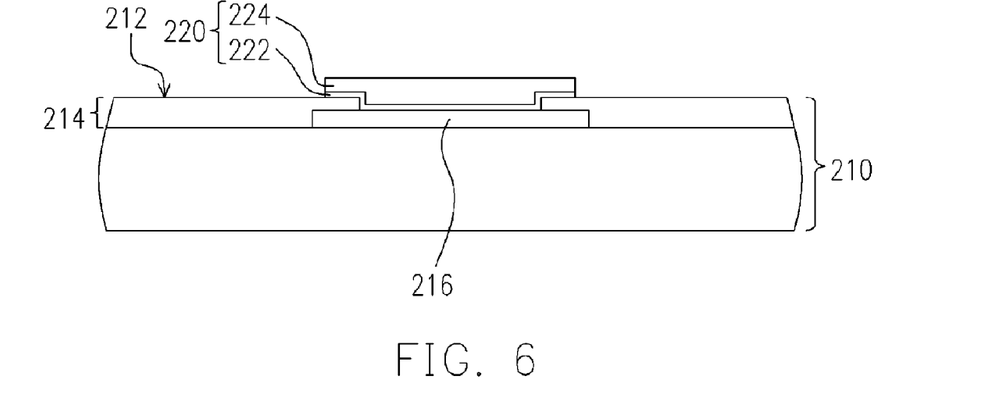
FIGS. 6 through 11 are partially magnified cross-sectional views showing the progression of steps for forming a bump on the surface of a chip according to one preferred embodiment of this invention.

FIGS. 6 through 11 are partially magnified cross-sectional views showing the progression of steps for forming a bump on the surface of a chip according to one preferred embodiment of this invention. As shown in FIG. 6, a silicon wafer 210 having an active surface 212 thereon is provided. The active surface 212 of the wafer 210 further includes a passivation layer 214 and a plurality of contact pads 216 (only one is shown). The passivation layer 214 exposes the contact pads 216. The contact pads 216 are aluminum or copper pads, for example. A process for forming an under-ball metallic layer 220 over the contact pad 216 is conducted. First, an adhesion layer 222 is formed over the active layer 212 of the wafer 210 by sputtering. Thereafter, one or more metallic layers 224 (only a single layer is shown) are formed over the adhesion layer 222 by sputtering or electroplating. Hence, the under-ball metallic layer 220 has a structure that includes a single adhesion layer 222 and a single or a stack of metallic layers 224. Photolithography and etching processes are carried out to pattern the under-ball metallic layer 220 so that only a residual portion of the under-ball metallic layer 220 remains on top of the contact pads 216. The adhesion layer 222 is made from a material including, for example, aluminum, titanium, titanium-tungsten alloy, chromium, chromium-copper alloy, copper or tantalum. The metallic layer 224 is made from a material including nickel-vanadium alloy, titanium nitride compound, tantalum nitride compound, nickel, chromium-copper alloy, chromium, copper, palladium or gold. Details of their structures can be found in Taiwan Patent Nos. 91,106,694 and 91,103,733.

Figure 7:
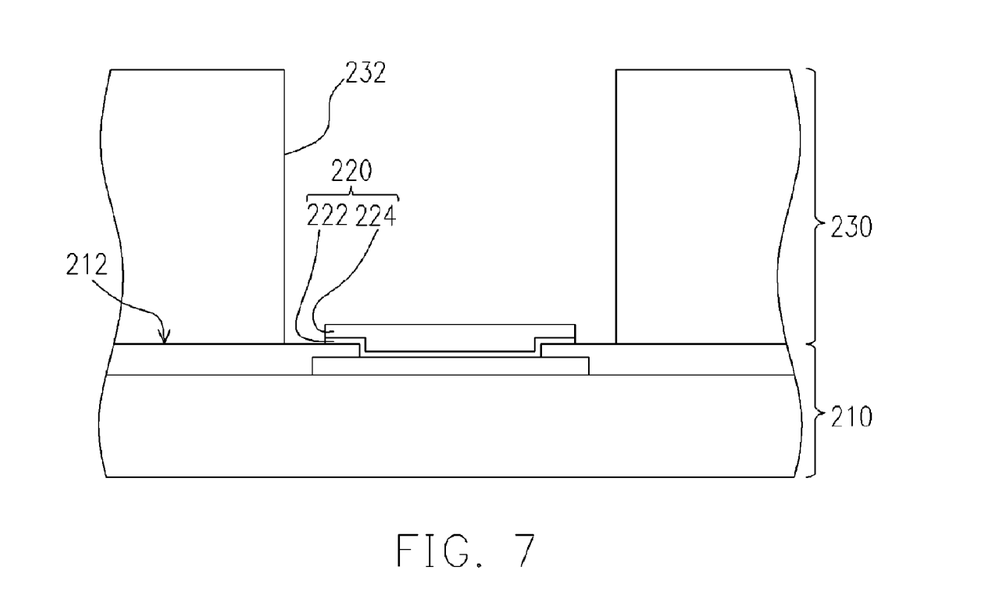

As shown in FIG. 7, a spin-coating process is conducted to form a photoresist layer 230 over the active surface 212 of the wafer 210. A photolithography process is carried out to form a plurality of openings 232 (only one opening is shown) in the photoresist layer 230. The openings 232 expose the under-ball metallic layer 220. It should be noted that the photoresist may be replaced by other patterned structure, such as patterned polymer formed by photolithography and etching processes. The patterned structure has openings exposing the under-ball metallic layer.

Figure 8:
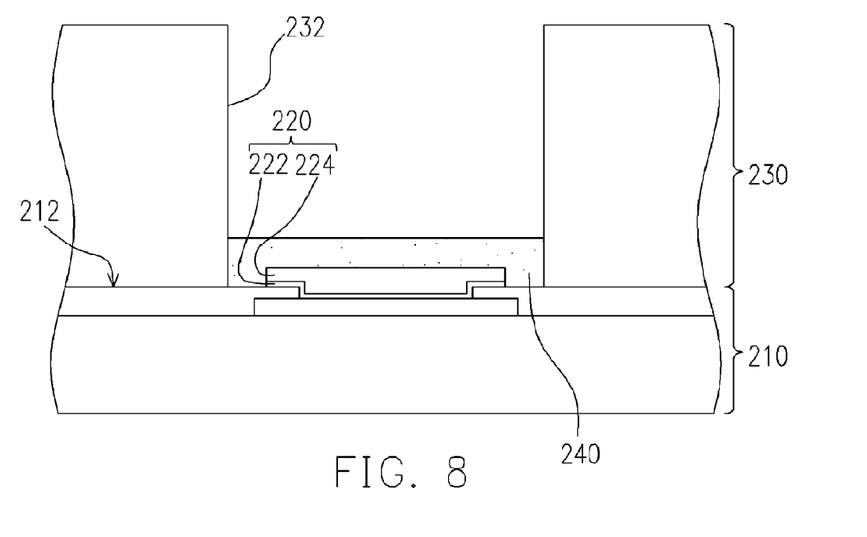
Figure 9:
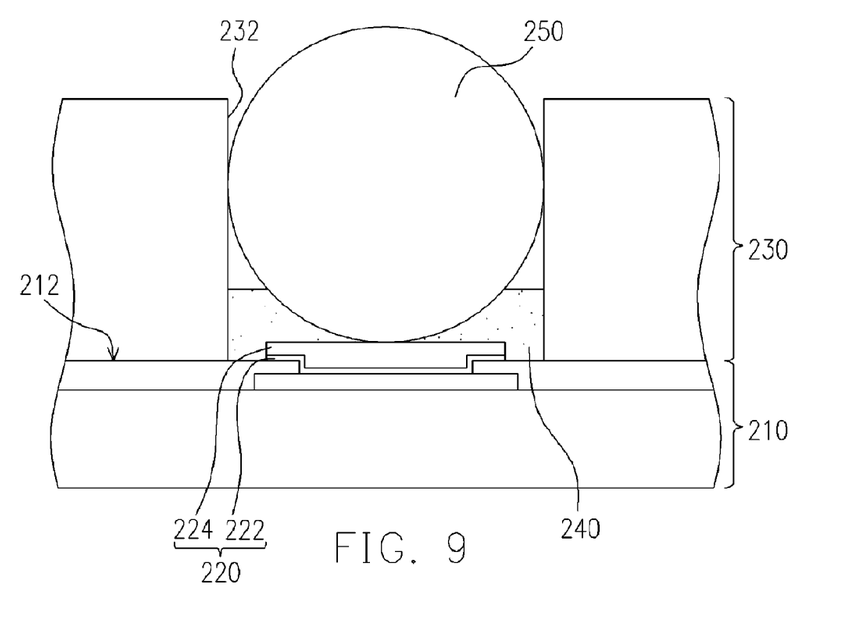

A spin-coating or jet-spraying method is used to coat a layer of flux material 240 into the openings 232 of the photoresist layer 230. The flux material 240 has the tendency to flow uniformly over the surface of the under-ball metallic layer 220 as shown in FIG. 8. Thereafter, a plurality of solder blocks 250 having a ball shape are disposed into the respective openings 232 of the photoresist layer 230 using a robotic dispenser (not shown), as shown in FIG. 9. The solder blocks 250 are made from a material including lead-tin alloy, tin, gold or other lead-free alloys. The lead-free solder blocks are mainly binary, tertiary, quaternary alloy consisting of some of the following metals: tin, gold, silver, copper, magnesium, bismuth, antimony, indium and zinc. Since the metals can be combined in different proportions, there are virtually countless types of lead-free blocks. In general, each type of lead-free solder block has a unique set of physical and electrical properties.

Figure 10:
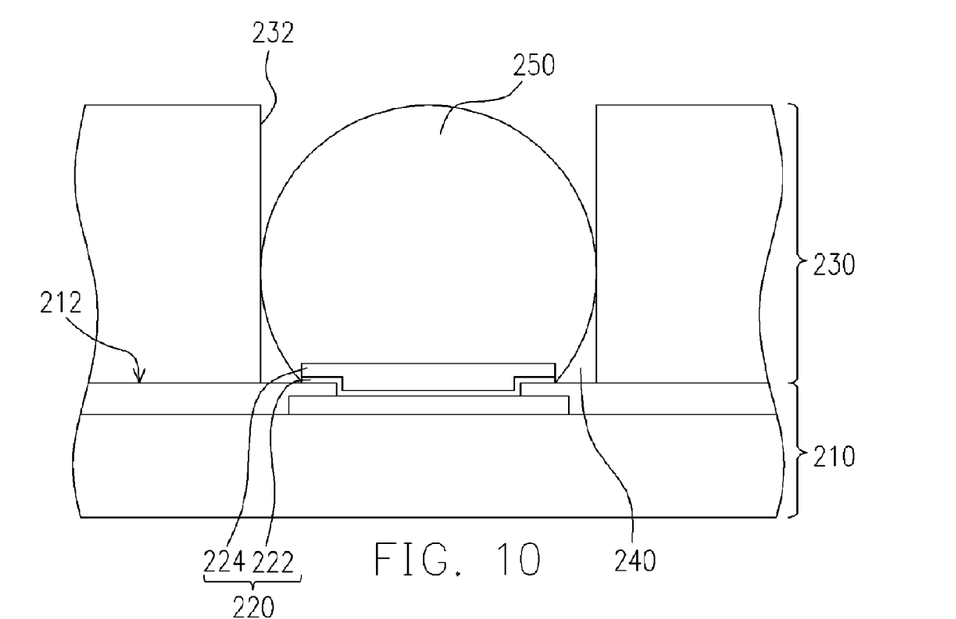
Figure 11:
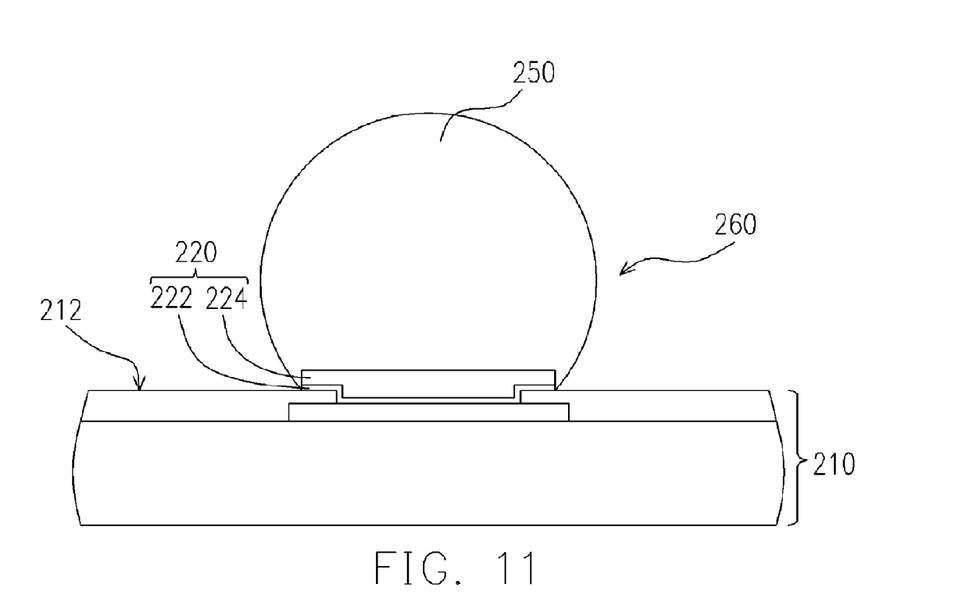

Through the flux material 240, the lower portion of the solder block 250 melts in a reflow process so that the solder block 250 and the under-ball metallic layer 220 are bonded together as shown in FIG. 10. A liquid cleaning agent is used to remove flux material 240 from the surface of the solder block 250. Finally, the photoresist layer 230 is removed from the active surface 212 of the wafer 210. So far, the process for forming bumps 260 is completed as shown in FIG. 11. Each bump 260 includes the solder block 250 and the under-ball metallic layer 220.

In the aforementioned process, the solder blocks 250 has been fabricated before disposed into the openings 232 of the photoresist layer 230, so the shape and interior composition of the solder blocks 250 can be carefully controlled. Therefore, the number and size of voids inside each solder block 250 can be set within an acceptable range. The reliability of the bond between the solder block 250 and the substrate (not shown) as well as between the solder block 250 and the under-ball metallic layer 220 is improved. Because the size of each solder block 250 is uniform, the solder block 250 is at a standard height level above the under-ball metallic layer 220 after a reflow process.

Moreover, the size of the openings 232 of the photoresist layer 230 can be greatly reduced. Only if the solder blocks 250 with a standard size can be accommodated into the openings 232, the openings 232 formed can be as small as possible. With smaller openings 232, the distance between neighboring solder blocks 250 can be reduced and a higher-density package can be produced.

In addition, if a solder block 250 is missing or does not fit into a particular opening 232, the vacant or misfit location can be easily spotted in a visual inspection and replaced. Thus, the condition of having missing blocks rarely occurs.

Figure 12:
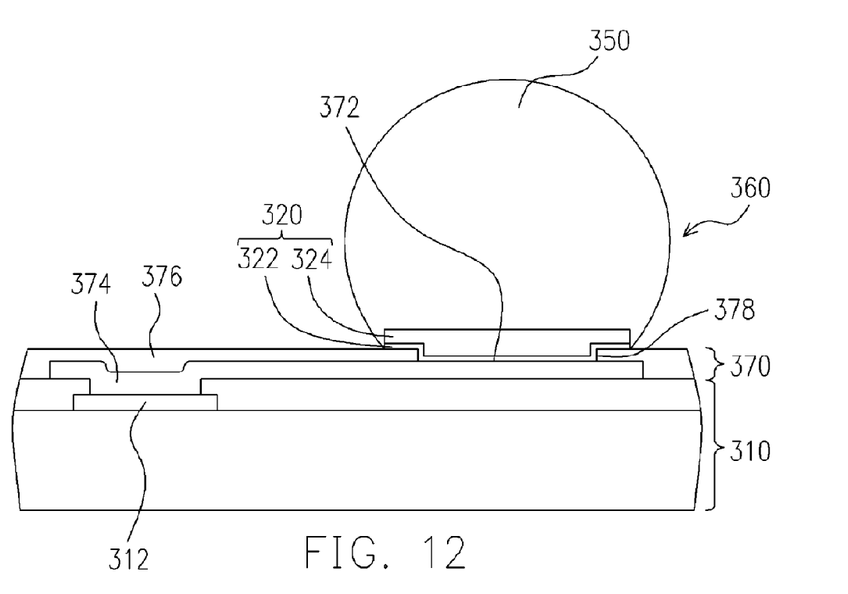
FIG. 12 is a partially magnified cross-sectional views showing a bump is formed on a contact pad of a redistribution layer deposed on a chip according to another preferred embodiment of this invention.

The process according to this invention is not limited to forming bumps over the active surface of a wafer but is equally applicable for forming bumps 360 over a redistribution layer 370, as shown in FIG. 12. After the redistribution layer 370 is formed on the wafer 310, the bumps 360 are formed on contact pads 372 of the redistribution layer 370 using the above bumping process. The redistribution layer 370 includes a patterned wiring layer 374 and a dielectric layer 376, the patterned wiring layer 374 interlacing inside the dielectric layer 376. The patterned wiring layer 374 is electrically connected with at least one contact pad 312 of the wafer 310. The dielectric layer 376 has an opening 378 exposing the patterned wiring layer 374 to define the contacts pads 372 where bumps 360 can be bonded. Since the fabrication of a redistribution circuit layer over a silicon wafer is familiar to those skilled in the technique, detailed description is omitted here. As above-mentioned, the bump 360 is a composite structure comprising the solder block 350 and the under-ball metallic layer 320 having an adhesion layer 322 and at least one metallic layer 324.

Figure 13:
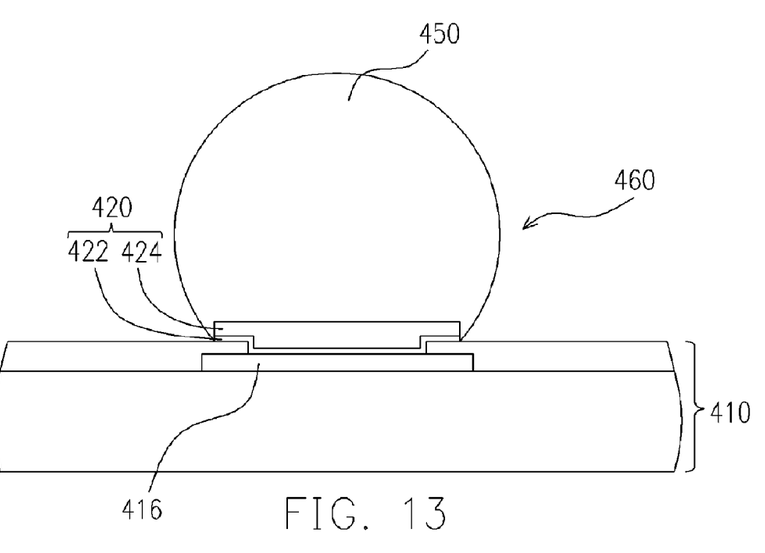
FIG. 13 is a partially magnified cross-sectional views showing a bump is formed on a contact pad of a substrate according to another preferred embodiment of this invention.

Aside from forming bumps over a silicon wafer or a redistribution layer, the process can be used to form bumps over other carriers such as a substrate as shown in FIG. 13. The bumps 460 can be formed on contact pads 416 of a substrate 410 using the above bumping process. As above-mentioned, the bump 460 is a composite structure comprising the solder block 450 and the under-ball metallic layer 420 having an adhesion layer 422 and at least one metallic layer 424.

In summary, this invention has the following advantages.

1. The solder blocks are fabricated prior to inserting into the openings in the photoresist layer. Size, shape and interior composition can be precisely controlled so that all the solder blocks will be highly uniform with little internal voids. Ultimately, the solder blocks and the substrate as well as the solder blocks and the under-ball metallic layer are reliably bonded together.

2. Since the shape of the solder blocks is carefully controlled, each solder block will have a uniform height above the under-ball metallic layer after the solder block and the under-ball metallic layer are bonded together in a reflow process.

3. The size of the openings in the photoresist layer can be greatly reduced. Only if the solder blocks with a standard size can be accommodated into the openings, the openings formed can be as small as possible. With a smaller opening dimension, the distance between neighboring solder blocks can be reduced and packing density can be increased.

4. If a solder block is absent from a particular opening, the vacant position can be easily spotted in a visual inspection before a reflow process and replaced. Thus, the condition of having missing blocks rarely occurs.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of forming bumps over contact pads, comprising the steps of:
   providing a substrate having contact pads thereon;
   forming a photoresist layer over the substrate, wherein the photoresist layer has openings therein, each opening exposing one of the contact pads;
   depositing a flux material within the openings to cover the contact pads;
   positioning a solder block inside each of the openings and on the flux material, wherein the solder blocks inside the openings have a ball shape;
   conducting a reflow process so that the solder blocks are bonded to the respective contact pads; and
   removing the flux material and removing the photoresist layer.

2. The method of claim 1, wherein before the step of depositing flux material over the contact pads, further includes forming an adhesion layer over the contact pads and a metallic layer over the adhesion layer, and the flux material is deposited on the metallic layer above the contact pads.

3. The method of claim 2, wherein material constituting the adhesion layer is selected from a group consisting of aluminum, titanium, titanium-tungsten alloy, chromium, chromium-copper alloy,, copper and tantalum.

4. The method of claim 2, wherein material constituting the metallic layer is selected from a group consisting of nickel-vanadium alloy, titanium nitride, tantalum nitride, nickel, chromium-copper alloy, chromium, copper and palladium.

5. The method of claim 1, wherein material constituting the solder blocks includes lead-tin alloy.

6. The method of claim 1, wherein material constituting the solder blocks includes lead-free alloy.

7. The method of claim 6, wherein material constituting the solder blocks is selected from a group consisting of lead, gold, silver, copper, magnesium, bismuth, antimony, indium and zinc.

8. The method of claim 1, wherein material constituting the contact pads is selected from a group consisting of copper and aluminum.

9. The method of claim 1, wherein the step of removing the flux material comprises using a liquid cleaning agent.

10. The method of claim 1, wherein the step of depositing a flux material within the openings to cover the contact pads comprises a spin-coating or a jet-spraying.

* * * * *